United States Patent [19]

Hartig et al.

[11] Patent Number: 4,863,756
[45] Date of Patent: Sep. 5, 1989

[54] METHOD AND EQUIPMENT FOR COATING SUBSTRATES BY MEANS OF A PLASMA DISCHARGE USING A SYSTEM OF MAGNETS TO CONFINE THE PLASMA

[75] Inventors: Klaus Hartig, Ronneburg; Anton Dietrich, Rodenbach, both of Fed. Rep. of Germany

[73] Assignee: Leybold Aktiengesellschaft, Cologne, Fed. Rep. of Germany

[21] Appl. No.: 15,128
[22] PCT Filed: Jun. 4, 1986
[86] PCT No.: PCT/EP86/00332
 § 371 Date: Feb. 2, 1987
 § 102(e) Date: Feb. 2, 1987
[87] PCT Pub. No.: WO86/07391
 PCT Pub. Date: Dec. 18, 1986

[30] Foreign Application Priority Data
 Jun. 14, 1985 [DE] Fed. Rep. of Germany ....... 3521318

[51] Int. Cl.⁴ .................. B05D 3/06; B05D 3/14; C23C 16/50; C23C 16/54
[52] U.S. Cl. .................................. 427/39; 427/40; 427/41; 427/47; 118/718; 118/723
[58] Field of Search ............... 427/38, 39, 40, 41, 427/47; 118/50, 50.1, 621, 623, 718, 723; 204/155, 156, 192.1, 192.12, 192.38, 298

[56] References Cited
U.S. PATENT DOCUMENTS

| | | | |
|---|---|---|---|
| 3,536,602 | 10/1970 | Jones et al. | 204/164 |
| 3,814,983 | 6/1974 | Weissfloch | 315/39 |
| 4,013,532 | 3/1977 | Cormia et al. | 427/41 |
| 4,282,267 | 8/1981 | Kuyel | 427/45.1 |
| 4,422,896 | 12/1983 | Class et al. | 204/298 |
| 4,479,369 | 10/1984 | Sando et al. | 118/718 |
| 4,481,229 | 11/1984 | Suzuki et al. | 427/38 |
| 4,598,022 | 7/1986 | Haque et al. | 427/41 |

FOREIGN PATENT DOCUMENTS 57-56036 4/1982 Japan .
1582231 1/1981 United Kingdom .

Primary Examiner—Norman Morgenstern
Assistant Examiner—Margaret Bueker
Attorney, Agent, or Firm—Felfe & Lynch

[57] ABSTRACT

Method for coating continuously moving substrates by the deposition of compounds from the gas phase by means of plasma discharge, produced by an electrode, with a chemical reaction, a system of magnets for the generation of a magnetic trap to constrict the plasma being disposed on one side of the substrate. The objective is to be accomplished by limiting the action of the plasma and the chemical reaction to the immediate vicinity of the system of magnets. For this purpose, the surface of the substrate to be coated is held at a distance "$S_1$" from the electrode, which is less than the dark-space distance that arises under the specified process conditions. Moreover, the magnetic trap is adjusted so that it passes through the substrate and is closed over the surface of the substrate to be coated and moreover in such a manner, that the constricted plasma is maintained on the surface of the substrate that is to be coated.

8 Claims, 3 Drawing Sheets

METHOD AND EQUIPMENT FOR COATING SUBSTRATES BY MEANS OF A PLASMA DISCHARGE USING A SYSTEM OF MAGNETS TO CONFINE THE PLASMA

The invention relates to a method for coating continuously moving substrates by the deposition of compounds from the gas phase by means of a plasma discharge produced by an electrode with a chemical reaction, a system of magnets for the generation of a magnetic trap to constrict the plasma being disposed on one side of the substrate A field of use is the coating of films and foils with polymers, which are deposited from polymerizable monomers from the gas phase. For this purpose, it is necessary to supply appropriately reactive monomers to the plasma or the corona discharge. A further field of use is the deposition of inorganic compounds. From the German Offenlegungsschrift 2,608,415 (corresponding to U.S. Pat. No. 4,013,532), a coating method of the initially described class is known, with which for example, layers of Polystyrene are to be produced. Two electrodes lie opposite each other in a parallel position at a distance of about 4 cm, and the substrate is passed in the middle between these electrodes. On the side of each electrode, facing away from the substrate position, there is a magnet system for the generation of a magnetic trap to constrict the plasma. The plasma, moreover, burns in the immediate vicinity of each electrode surface and at some distance from the substrate, so that the polymer is deposited on the electrode surfaces. It has also been reported that the cathode vaporizing rate of the electrode material is observed to be much lower than that of the material deposited on the electrode. The known method is based on the hope that the polymer is first of all produced from the gas phase on the electrodes and vaporized once again from there in the direction of the substrate. The occurrence of the effect described is based on the fact that a plasma is maintained between the substrate that is to be coated and the electrode facing this surface and this, in turn is possible only because the distance between the substrate and electrode surfaces is several times as large as dark space distance that arises under the given process conditions. Disregarding the substrate thickness the actual distance present is about 20 mm, while the dark-space distance, arising under the process conditions, is of the order of 3 mm at most. With the known method, not only the electrodes but also other parts of the interior facilities of the evacuatable reaction chamber are coated and contaminated. From the paper by Morosoff, Newton and Yasuda, "Plasma Polymerization of Ethylene by Magnetron Discharge", published in the J. Vac. Sci. Technol., 15(6), Nov./Dec. 1978, pages 1815 to 1822, a very similar method and very similar equipment are known, in which the clear distance between the electrode plates is 7.6 cm. Here also, it is a matter of supplying monomer vapors to the plasma, which deposit as polymers on the substrate. It is also a matter here of depositing the polymer initially on the aluminum electrode plates and of vaporizing it from there in the direction of the substrate.

From the paper by Kaganowicz, Ban and Robinson, "Spatial Effects in Plasma Deposition of $SiO_x$ Using Magnetically Enhanced Glow Discharge" published in the ISPC-6 Montreal, July 1983, Number C-7-6, a once again comparable method and comparable equipment are known for the production of silane layers from silicon compounds In the equipment described there two magnetron cathode also lie opposite one another in mirror symmetrical fashion and the clear distance between the electrode plates is 5 cm. The authors report the observation that the layer composition is highly dependent on the spatial distance from the electrodes and that coating material deposits even in the vicinity of the outlet of the reaction chamber far removed from the electrodes. The dependence of the layer composition on the distance from the electrodes has the disadvantage especially when moving substrates are being passed continuously between the electrodes, that rather inhomogeneous layers are formed. In this connection, one must realize that the construction of the layer commences at a low deposition rate already at some distance from the gap between the electrodes, that the deposition rate during the passage of the substrate through said gap passes through a maximum and that the nature of the layer and the deposition rate after the substrate leaves the gap change in a manner opposite to that before the substrate enters the gap.

Not only is the composition of the layer itself of decisive importance for the construction of the layer, but also the angle of incidence of the individual layer particles on the substrate. For example, it may be noticed in numerous coating processes that the adhesion of the layer material to the substrate is considerably worse, when the coating process takes place at an angle, especially at an acute angle. For most applications, such an inferior adhesion is highly undesirable.

It is therefore an object of the invention to provide a coating process of the initially described class, in which the chemical reaction is restricted to the immediate vicinity of the system of magnets and of the substrate. In particular, the condensation of layer material at locations removed from the system of magnets shall be prevented and the buildup of largely homogeneous layers shall be made possible.

This objective is accomplished in accordance with the invention by the process described at the beginning owing to the fact that the surface of the substrate that is to be treated is held at distance "$S_1$" from the electrode, which is smaller than the dark-space distance that arises under the given process conditions and that the magnetic trap is so adjusted, that it passes through the substrate and is closed over the surface of the substrate that is to be coated in such a manner, that the chemical reaction is maintained in the constricted plasma on the surface of the substrate that is to be coated.

The essential difference from the state of the art lies therein that the plasma burns exclusively on the side of the substrate that lies opposite to the system of magnets (even when the system of magnets is present as only a simple system without mirror symmetry. The distance between the substrate and the system of magnets or the electrode, optionally lying between the substrate and the system of magnets and belonging to the equipment, is so small, that a chemical reaction or a corona discharge cannot develop at this place. This distance must be less than the so-called dark-space distance, which is adequately defined in plasma physics. It is about 1 to 3 mm for the initially described process parameters and in no case exceeds 3 mm.

Due to the inventive conduct of the method, the coating process is restricted to the immediate area of action of the plasma on the substrate. Moreover, the condensation of the layer material likewise takes place practically exclusively in the region of the plasma and, more particularly. no parts of the equipment are coated. Owing to this, the degree of utilization of the coating material, which is expensive in many cases, is improved substantially and the otherwise necessary cleaning of the equipment is reduced substantially. Due to the suppression of the coating process outside of the actual discharge region, a precoating of the substrate material, which is supplied continuously to the coating zone, is avoided, so that an exceptionally homogeneous buildup of the layer is achieved. More particularly, a harmful precoating at an acute angle is avoided.

The substrate may comprise various materials, such as, for example, metals, semiconductors or insulating materials such as glass, plastic and ceramic. Provided than an electrically conductive substrate is used, it is possible to do without a separate electrode. In this case, the substrate itself is connected to an appropriate (negative) voltage and is identical with the electrode. In the case of movable substrates, this can be accomplished by the use of a contact roller (FIG. 2). For the treatment of substrates of a nonconducting material, such as plastic films, a separate electrode is disposed between the substrate and the system of magnets and connected with a voltage source (FIG. 3). The voltage source, moreover, is of such a nature, that the electrode can be connected either to a negative direct current voltage or to a high frequency source. With the usual relative dimensions of the electrode and the remaining components of the reaction chamber, which are grounded, the electrode assumes a negative bias voltage. Moreover, neither the distance between the electrode and the system of magnets nor the distance between the electrode and the substrate may be larger than the aforementioned darkspace distance, so that any corona discharge in the aforementioned spaces is avoided.

It is, however, also possible to combine the electrode structurally and electrically conductive with the system of magnets. In such a case, it is then only necessary to ensure that the whole arrangement, including the system of magnets, is insulated electrically from the metallic parts of the reaction chamber.

When using a stationary electrode, that is, an electrode that is independent of the substrate, it is particularly advantageous to proceed in such a manner that the first surface of the substrate that faces the electrode is held at a distance "$S_2$" from the electrode, which is smaller than the given dark-space distance under the specified process conditions, and that the magnetic trap is adjusted so that it passes through the substrate and is closed over the second surface of the substrate, which is averted from the electrode, in such a manner, that the chemical reaction is maintained in the constricted plasma on the side of the substrate averted from the electrode (FIG. 3).

The inventive method is suitable with particular advantage for coating films moving continuously over the electrode or relatively to the system of magnets, since an exceptionally uniform coating process—as viewed over the length of the substrate—can be carried out due to this relative motion.

The invention also relates to a chemical reactor for carrying out the method described above. In a conventional manner, such equipment has at least one evacuatable reaction chamber with at least one feeding device for the reaction components, a holding device for at least one substrate, an electrode is posed in the vicinity of the substrate position for generating a plasma and, on the side of the electrode opposite to the substrate position, a system of magnets with pole faces of opposite polarity for producing an in itself closed magnetic trap, which starts out from the pole faces and passes through the electrode.

To accomplish the same objective, such equipment is characterized pursuant to the invention owing to the fact that the holding device is disposed in such a spatial position relative to the electrode, that the first surface of the substrate, which facts the electrode, is at a distance "$S_2$" from the electrode, which is less than the given dark space distance under the specified process conditions, and that the magnetic trap is adjusted, so that it passes through the substrate and is closed over the second surface of the substrate, which is averted from the electrode, in such a manner, that the constricted plasma and the chemical reaction zone are on the side of the substrate averted from the electrode.

Further advantageous refinements of the object of the invention arise out of the remaining dependent claims.

For the object of the invention, the spatial extent of the plasma is limited to the immediate vicinity of the electrode and of the system of magnets behind the electrode. Owing to this. the coating conditions are fulfilled only in the immediate vicinity of the substrate. The portion of the energy. used for the coating process, can be controlled exceptionally accurately, so that the deposition rates and the coating properties can be adjusted precisely and reproducibly.

Coating of parts of the equipment is avoided practically completely. so that there is none of the feared flaking or peeling of layer material. which otherwise collects in the course of time on parts of the equipment and. in the event that it flakes, leads to breakdowns or defective layers. Impurities, which deposit on the substrates that are to be coated lead to local interruptions in the layer. If it is a question of very small particles, so-called miniature holes or pinholes arise on the substrates and unavoidably lead to material that will be rejected.

Furthermore, with the object of the invention, the concentration of the plasma can be adjusted and defined very well by the gas pressure, the relative position and strength of the magnetic field and the electric field strength, so that the reproducibility of the method is improved further.

The method and the equipment are described in greater detail by means of FIGS. 1 to 5.

Figure 1:
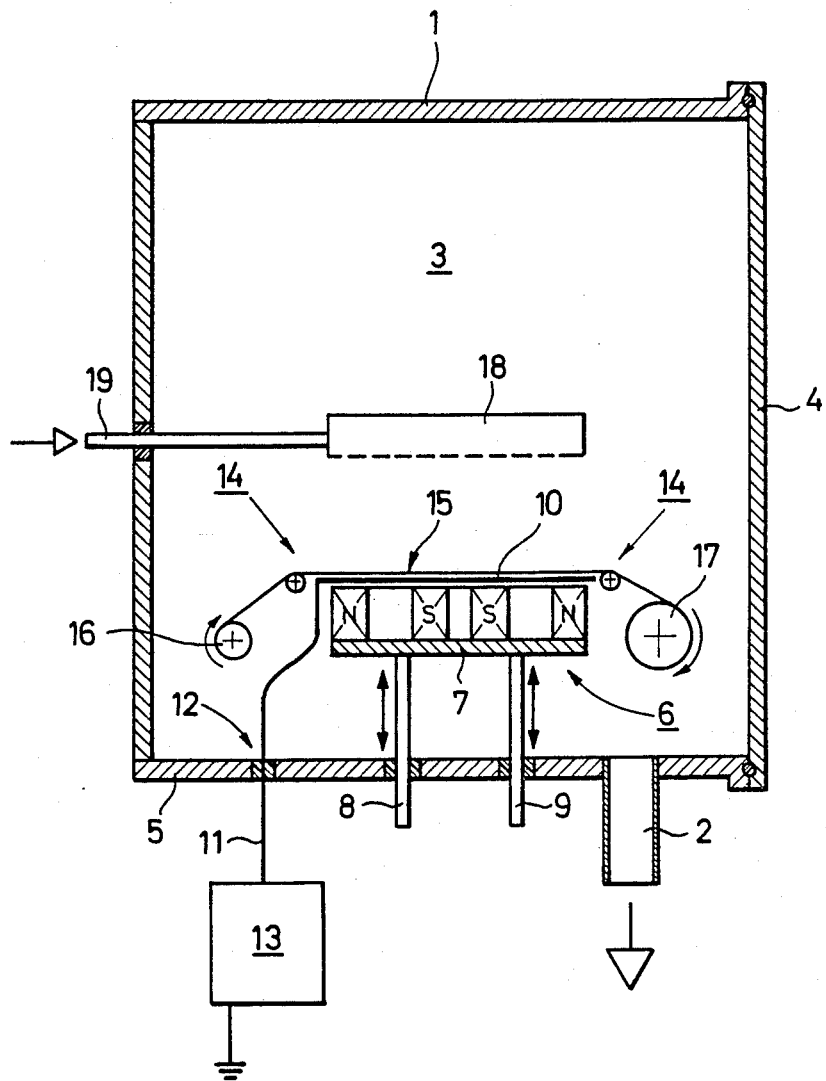
FIG. 1 shows a vertical section through a device for coating a continuously moving plastic film.

In FIG. 1, a reaction chamber 1 is shown, which can be connected over a vacuum line 2 to a set of vacuum pumps, which are not shown. The interior 3 of the reaction chamber is accessible through a door 4.

The reaction chamber has a base 6, on which a system of magnets 5, the height of which can be altered, is mounted. This system of magnets comprises a ferromagnetic crossbar plate 7, on which two in themselves closed rows of permanent magnets are disposed. The upwardly directed pole faces of these magnets are polarized oppositely and, moreover, the south poles of the inner row of magnets and the north poles of the outer row of magnets lie at the top. A closed tunnel of magnetic lines of flux lying above the pole faces, such as is known from the so-called atomizing magnetron is formed in this manner. Such a magnetron is described, for example, in the German Offenlegungsschrift 3,047,113, where it is shown, however, in the reverse position. The crossbar plate 7, the height of which is adjustable, is mounted on supports 8 and 9, which may be in the form of pipes and can serve for supplying and discharging cooling water.

Immediately above the pole faces, a plate-shaped electrode 10 is disposed, which covers all the pole faces and is connected with voltage source 13 via a cable 11, which is passed out of the reaction chamber through a vacuum leadthrough 12. The voltage source 13 is either a direct-current voltage source, to the negative pole of which the electrode 10 is connected, or a high-frequency source with a frequency of, for example, 13.56 MHz. The supplying of electrode 10 with high frequency leads to a negative bias voltage of this electrode relative to the reaction chamber 1.

A holding device 14 for the substrate 15, which comprises a film, is assigned to the electrode 10. In the present case, the holding device is formed by two guide rollers, which guide the substrate is in a plane-parallel position horizontally over the electrode 10. The substrate 15 is supplied from a supply reel 16 and 17, after the plasma treatment, is collected once again on a windup reel. Above the electrode 10 or above the substrate position defined by the holding device 14, there is a gas-feeding device 18, to which the necessary reaction gas, preferably in admixture with an inert gas such as argon, is supplied over a pipeline 19 from a storage tank, which is not shown. The gas-feeding device has a plurality of openings, through which the gas can emerge distributed over a large area in the direction of the substrate.

Figure 2:
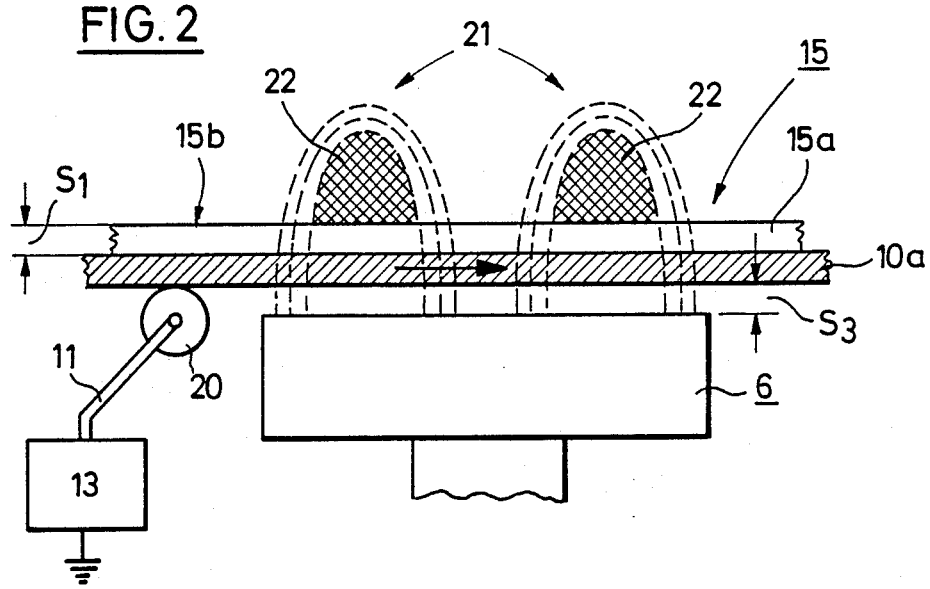
FIG. 2 shows a segment of FIG. 1 on an enlarged scale with the variation that a stationary electrode is omitted and that the conductive substrate itself form the electrode.

In FIG. 2, an arrangement is shown, in which the substrate 15 itself comprises an electrically conductive material (metal) and consequently assumes the function of the electrode 10 in FIG. 1. The conductive part of the substrate 15 is consequently labelled 10a. The necessary voltage is supplied from a voltage source 13 over a contact roller 20 to this conductive part. In the present case, the conductive part 10a of the substrate 15 is provided with an insulating coating 15a which may, for example, be formed from a film of insulating material, in order to show that so-called composite films also come into consideration as substrate 15.

The so-called "magnetic trap 21" is shown by magnetic lines of flux, which are indicated by the broken lines; the plasma 22, which is constricted or enclosed by this magnetic trap, is shown by the crosshatched area. The surface 15b of the substrate 15 that is to be treated is averted from the system of magnets 6 and the conductive part 10a. The distance $S_1$ between the surface 15b of the substrate that is to be treated and the electrode (conductive part 10a) is less than the dark-space distance, which arises under the specified process conditions. In the present case, a corona discharge cannot develop at all between the surface 15b that is to be coated and the electrode or the conductive part 10a, because the coating of insulating material 15a, which belongs to the surface 15b that is to be coated, is in physical contact with the conductive part 10a. It is therefore a question of a limiting case. A further limiting case exists when the coating of insulating material 15a is not present. In this case, the distance $S_1 = 0$. It should also be noted that the distance $S_3$ between the back of the electrode (the conductive part 10a) and the system of magnets 6 must likewise be smaller than the dark-space distance, which arises under the specified process conditions.

In particular, however, it can be seen in FIG. 2 that the magnetic trap is so adjusted, that it passes through the substrate 15 and is closed over the surface of the substrate to be coated in such a manner, that the constricted plasma 22 is maintained on the surface 15b of the substrate, which is to be coated and which is averted from the system of magnets 6.

Figure 3:
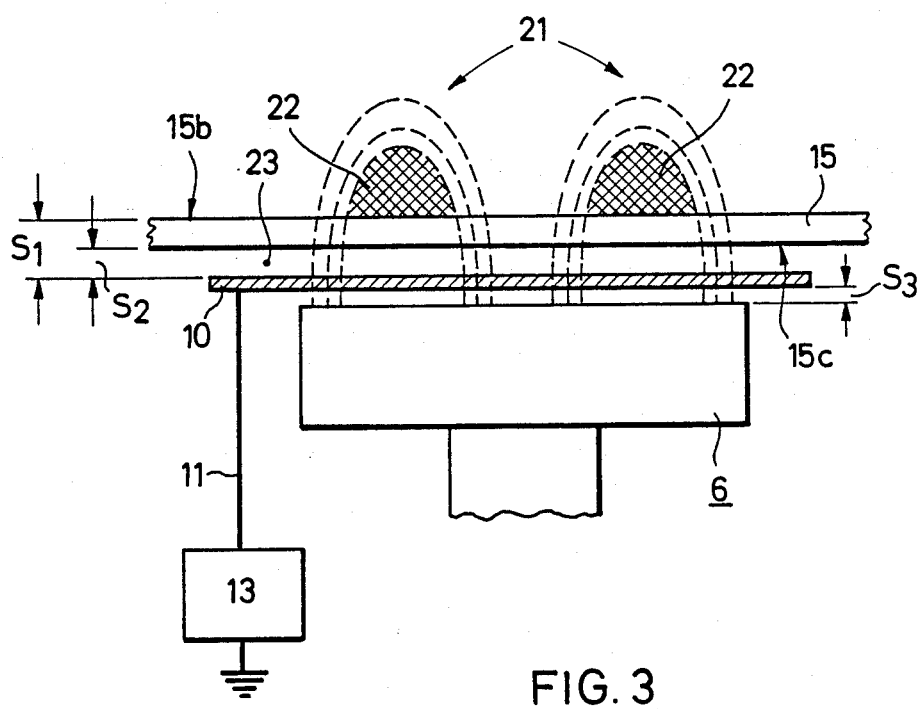
FIG. 3 shows a segment of FIG. 1 on an enlarged scale.

FIG. 3 shows the relationships in the lower part of the device of FIG. 1 on a larger scale. In this case, a stationary electrode 10 is assigned to the system of magnets, the distance $S_3$ once again being less than the aforementioned dark-space distance. In this case, the substrate 15 comprises an insulating material, for example, a thermoplastic film, the thickness of which has been exaggerated in the drawing in relation to the electrode 10. Here also, the substrate 15 has a surface 15b that is to be coated. The substrate, moreover, has a surface 15c facing an electrode 10, and the distance $S_3$ between this surface 15c and the electrode 10 once again is less than the dark-space distance, which arises under the specified process conditions. The distance $S_1$ between the surface 15b, which is to be treated, and the same electrode 10 is not markedly different in practice from the aforementioned distance $S_2$, because the thickness of the substrate 15, which corresponds to the difference between $S_1$ and $S_2$, is negligible in relation to the other dimensions. The thermoplastic films, which are to be treated in the usual manner, have thickness between 1 and 5 $\mu$m. In each case, the gap 23, the width of which corresponds to the distance $S_2$, should be kept so narrow, that it does not support a corona discharge. Here also, it can be seen that the magnetic trap is adjusted, so that it passes through the substrate and is closed above the surface 15b, which is to be coated and is averted from the electrode, in such a manner that the constricted plasma is on the side of the substrate, which is averted from the electrode.

Figure 4:
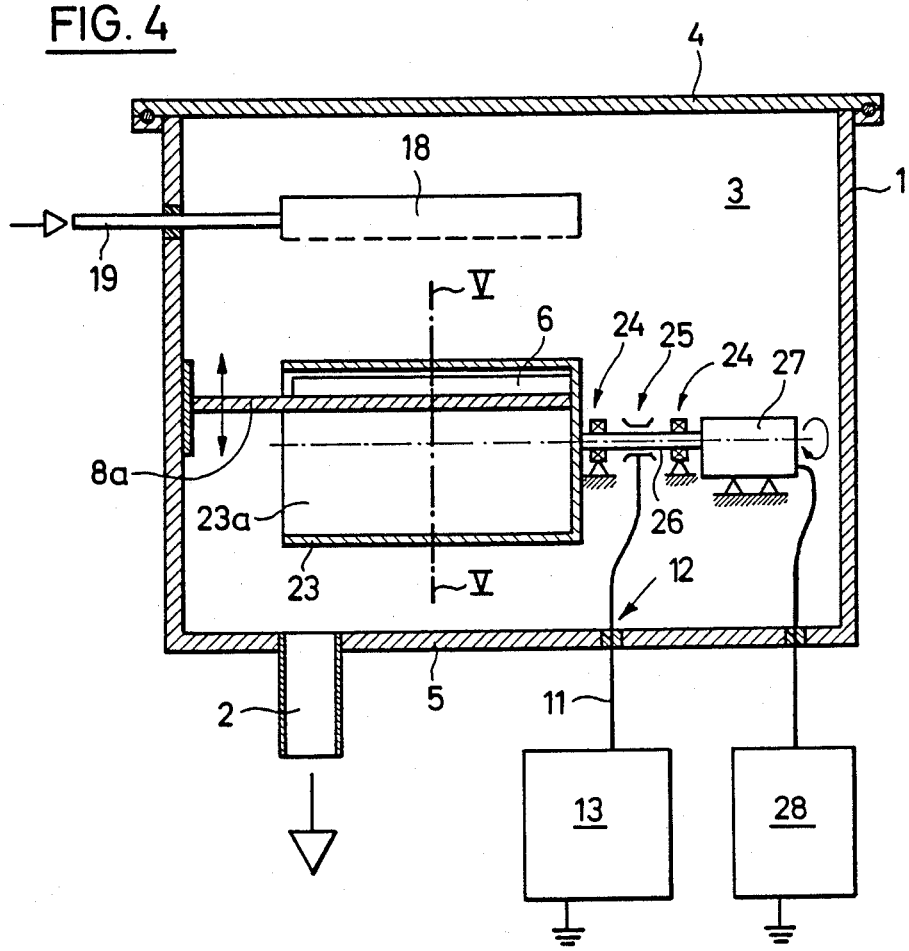
FIG. 4 shows a vertical section through a device for coating a hollow cylindrical drum or a film passed over this cylinder.

In FIG. 4, parts, which are the same as before have been given the same reference numbers.

Figure 5:
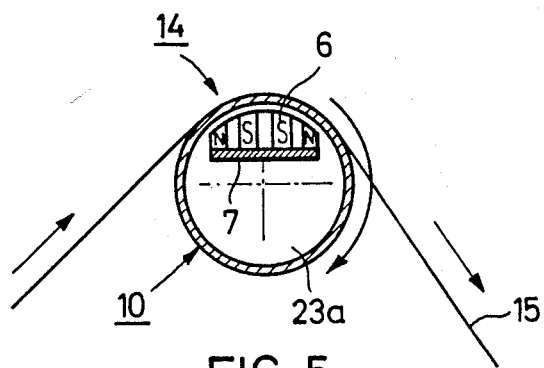
FIG. 5 shows a section along the line V-V through the object of FIG. 4.

In the present case, the holding device 14 comprises a hollow guide roller 23, which at the same time is the electrode 10 and in the interior 23a of which the system of magnets 6 is accommodated. As is evident from FIG. 5, the pole faces of the system of magnets 6, which are not described in greater detail, lie on a cylindrical surface, which is disposed as close as possible to the interior cylindrical surface of the guide roller 23. The film-shaped substrate 15 can be guided over the guide roller 23, as shown in FIG. 5. In principle, this arrangement corresponds to that of FIG. 2. It is furthermore even possible to use the guide roller 23 not only as an electrode, but at the same time also as a substrate. That is, the (exchangeable) guide roller is the end product and is subjected to a special surface coating process.

The guide roller 23 also has a shaft 26, which is supported on pivot bearings 24 and is connected over a sliding contact 25 with the voltage source 13. The opposite end of the shaft 26 is connected with a drive motor 27, the speed of which can be controlled by a drive control 28.

The method and the equipment are suitable for a whole series of reactive coating processes. For example, inorganic layers can be produced from gaseous or volatile compounds of silicon, germanium, arsenic, boron, aluminum, titanium, phosphorus and gallium. It is furthermore possible to produce polymeric layers from polymerizable monomers, for example. polymethylmethacrylate from methyl methacrylate. Moreover, it is possible to produce amorphous carbon layers from hydrocarbon compounds such as $C_2H_2$ or $C_4H_{10}$.

EXAMPLE

Substrates of glass, aluminum and plastic were accommodated in plate or film form in the equipment shown in FIG. 1. Methyl methacrylate ($C_5H_8O_2$), with addition of 5 volume percent of argon, was introduced through a metering valve into the reaction chamber in an amount of 60 cc/sec, a process pressure of $2.2 \times 10^{-2}$ mbar being maintained by pumping down appropriately. An electrode voltage of 100 V with a wattage of 800 W was applied to a magnetron cathode of the type PK 500 (manufacturer: Leybold-Heraeus GmbH). The total cathode area was 450 cm$^2$. The deposition rate was 3 nm/sec. Layers of plasma-polymerized methyl methacrylate were obtained, which were transparent and had a refractive index of 1.5 to 1.6. By increasing the wattage, it was possible to achieve deposition rates of more than 6 nm/sec.

We claim:

1. Method for coating continuously moving substrates by the deposition of compounds from the gas phase by means of a plasma discharge, produced by a negatively biased electrode, with a chemical reaction, a system of magnets for the generation of a magnetic trap which is a closed tunnel to constrict the plasma being disposed on one side of the substrate, wherein the substrate is one of the electrode and a member independent of the electrode and wherein the surface of the substrate that is to be treated is held at distance "$S_1$" from the electrode, which is less than the dark-shape distance that arises under the given conditions of the process, where "$S_1$" includes zero, and the magnetic trap is so adjusted, that it passes through the substrate and is a closed tunnel over the surface of the substrate that is to be coated in such a manner, that the chemical reaction is maintained in the constricted plasma on the surface of the substrate that is to be coated.

2. Method as defined in claim 1 for coating substrates that are moved over an electrode, said electrode being a stationary electrode, wherein the first surface of the substrate that faces the electrode is held at a distance "$S_2$" from the electrode, which is less than the given dark-space distance under the specified process conditions, and that the magnetic trap is adjusted so that it passes through the substrate and is closed over the second surface of the substrate, which is averted from the electrode, in such a manner, that the chemical reaction is maintained in the constricted plasma on the side of the substrate averted from the electrode.

3. Method as defined in claim 1 for coating substrates with polymers, wherein polymerizable substances are supplied to the plasma continuously.

4. Method as defined in claim 1, wherein the electrode is held at a negative potential.

5. Chemical reactor for implementing the method of coating continuously moving substrates by the deposition of compounds from the gas phase by means of a plasma discharge, with an evacuatable reaction chamber with at least one feeding device for the reaction components, with a holding device for at least one substrate, with an electrode disposed in the vicinity of the substrate position for generating a plasma and, on the side of the electrode opposite to the substrate position, with a system of magnets with pole faces of opposite polarity for producing an in itself closed magnetic trap which is a closed tunnel, which starts out from the pole faces and passes through the electrode, wherein the holding device is disposed in such a spatial position relative to the electrode, that the first surface of the substrate, which faces the electrode, is at a distance "$S_2$" form the electrode, which is less than the given dark-space distance under the specified process conditions, and the magnetic trap is adjusted, so that it passes through the substrate and is a closed tunnel over the second surface of the substrate, which is averted from the electrode, in such a manner, that the constricted plasma and the chemical reaction zone are on the side of the substrate averted from the electrode.

6. Equipment as defined in claim 5; wherein the holding device for the substrate comprises at least one guide roller, by means of which the substrate can be guided parallel to and over the electrode.

7. Equipment as defined in claim 6, wherein the holding device for the substrate comprises a hollow guide roller, which simultaneously is the electrode and in the hollow space or of which the system of magnets is accommodated.

8. Equipment for implementing the method of coating continuously moving substrates by the deposition of compounds from the gas phase by means of a plasma discharge comprising:
an evacuatable reaction chamber with at least one feeding device for the reaction components;
a holding device for at least one substrate, the holding device for the substrate comprising a hollow guide roller, which simultaneously is an electrode for generating a plasma; and
a system of magnets disposed in a hollow space of the guide roller with pole faces of opposite polarity for producing an in itself closed magnetic trap, which starts out from the pole faces and passes through the electrode, the magnetic trap being adjusted so that it passes through the substrate and is closed over the surface of the substrate, which is averted from the electrode in such a manner that the constricted plasma and the chemical reaction zone are on the side of the substrate averted from the electrode.

* * * * *